United States Patent
Deng et al.

(10) Patent No.: US 12,401,381 B2
(45) Date of Patent: Aug. 26, 2025

(54) OUTPUT ARRAY FOR RF PERFORMANCE IMPROVEMENT

(71) Applicant: Huawei Technologies Co., Ltd., Shenzhen (CN)

(72) Inventors: Jason Xiangdong Deng, Greensboro, NC (US); Yuanyue Jin, Oak Ridge, NC (US); Wael Yahia Refai, Greensboro, NC (US); Jose Gonzalez, Greensboro, NC (US); Daniel Lee Kaczman, Oak Ridge, NC (US); Shaikh Alam, Oak Ridge, NC (US)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 387 days.

(21) Appl. No.: 17/940,440

(22) Filed: Sep. 8, 2022

(65) Prior Publication Data
US 2023/0006702 A1 Jan. 5, 2023

Related U.S. Application Data

(63) Continuation of application No. PCT/US2020/054256, filed on Oct. 5, 2020.

(60) Provisional application No. 63/032,601, filed on May 30, 2020.

(51) Int. Cl.
*H04B 1/04* (2006.01)

(52) U.S. Cl.
CPC ... *H04B 1/0458* (2013.01); *H04B 2001/0416* (2013.01)

(58) Field of Classification Search
None
See application file for complete search history.

(56) References Cited

U.S. PATENT DOCUMENTS

| | | |
|---|---|---|
| 2002/0097097 A1 | 7/2002 | Sugiura |
| 2009/0015336 A1* | 1/2009 | Aoki ............... H03F 1/0277 330/285 |
| 2018/0248468 A1* | 8/2018 | Ying ............... H02J 3/46 |
| 2018/0287561 A1* | 10/2018 | Hwang ............ H03F 3/245 |
| 2018/0358933 A1 | 12/2018 | Matsui et al. |
| 2019/0006994 A1 | 1/2019 | Sasaki |

* cited by examiner

*Primary Examiner* — Frantz Bataille
(74) *Attorney, Agent, or Firm* — Slater Matsil, LLP

(57) ABSTRACT

A power amplifier output stage includes a first output array group having a first plurality of semiconductor devices, and a first loading adjustment module coupled to the first output array group. The first loading adjustment module is configured to adjust a loading of the first output array group to produce a first power dissipation value associated with the first output array group. The power amplifier output stage further includes a second output array group having a second plurality of semiconductor devices, and a second source loading adjustment module coupled to a second input of the second output array. The second source loading adjustment module is configured to adjust a source loading of the second output array group to produce a second power dissipation value associated with the second output array group, the first power dissipation value being different from the second power dissipation value.

47 Claims, 11 Drawing Sheets

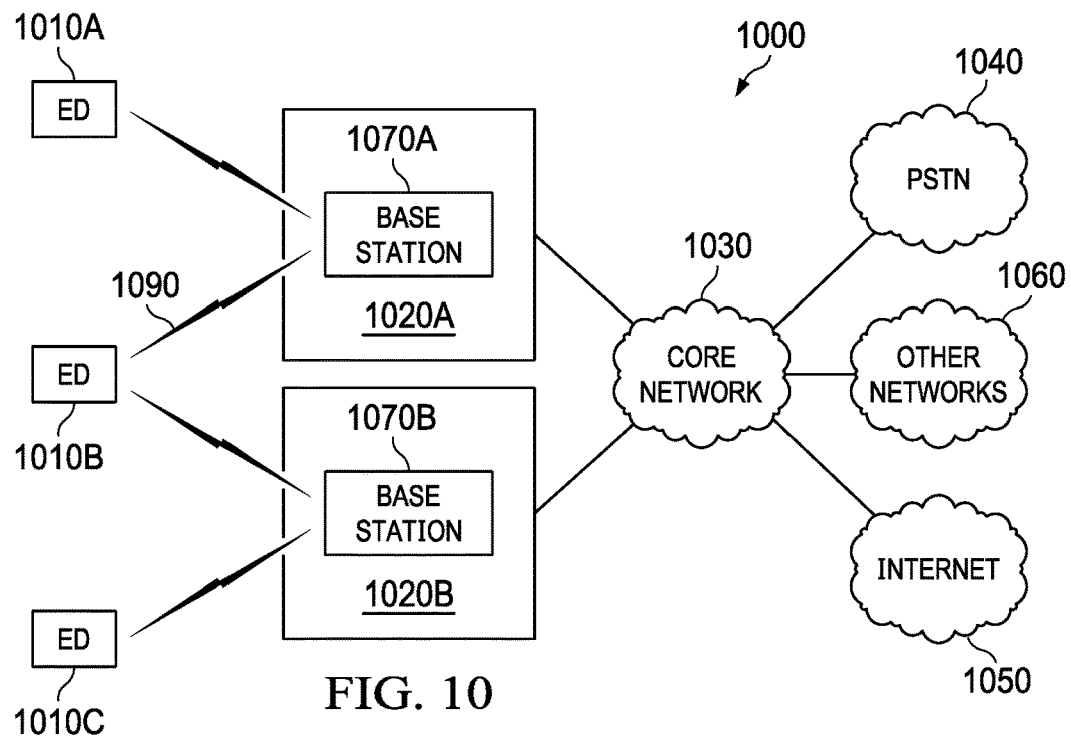
FIG. 10
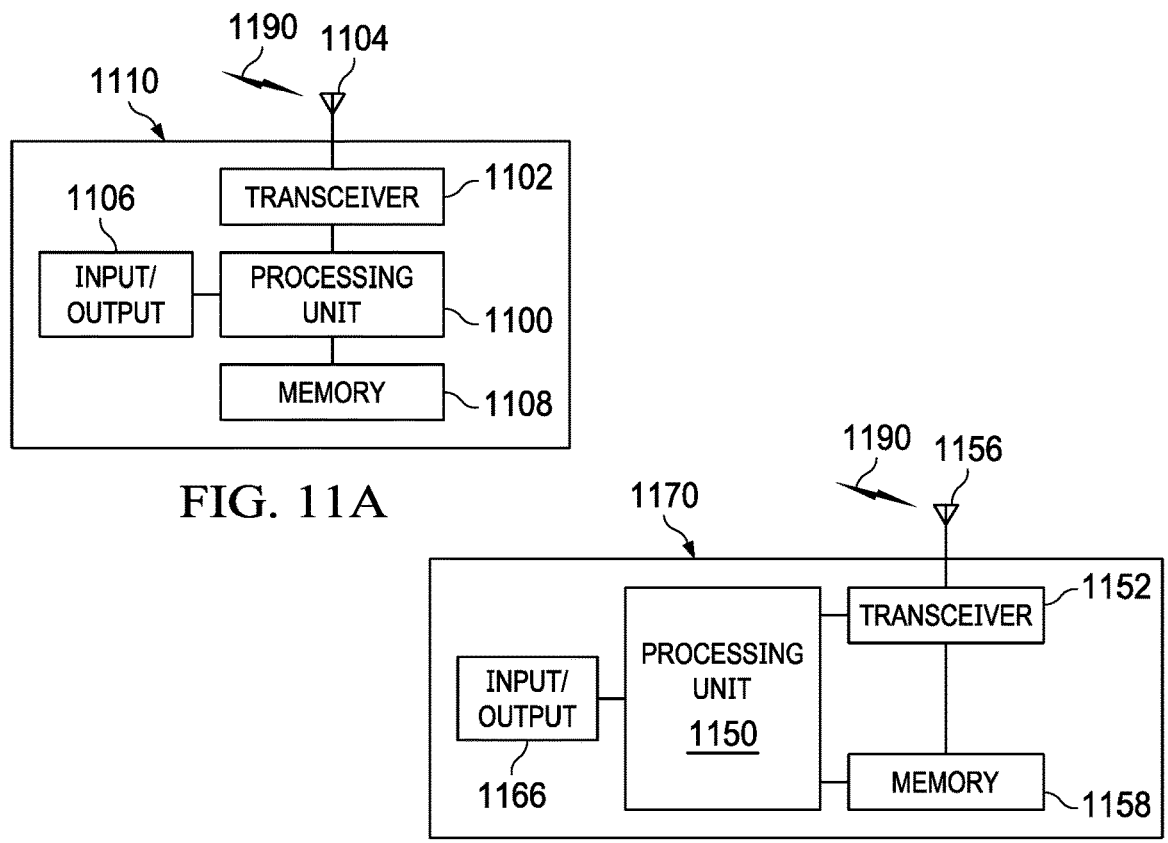
FIG. 11A
FIG. 11B

OUTPUT ARRAY FOR RF PERFORMANCE IMPROVEMENT

CROSS-REFERENCE TO RELATED APPLICATIONS

This application is a continuation of International Application PCT/US2020/054256, filed Oct. 5, 2020, entitled "Output Array for RF Performance Improvement," which claims the benefit of U.S. Provisional Application No. 63/032,601, filed on May 30, 2020, entitled "Nonuniform Segmented Output Array and Loading For Thermal and Other RF Performances Improvement," applications of which are incorporated herein by reference in their entireties.

TECHNICAL FIELD

The present disclosure relates generally to a system and method for digital communications, and, in particular embodiments, to a radio frequency (RF) power amplifier including a non-uniform segmented output array having non-uniform loading for thermal and other RF performance improvement.

BACKGROUND

In a wireless terminal, such as a user equipment (UE), a cellular phone, or other wireless communication equipment, a radio frequency (RF) power amplifier (PA) front end module is a critical component. The role of the RF PA front end module is to amplify modulated RF signals received from a transceiver baseband accurately, and send the amplified modulated RF signals to an antenna for radiating out to a base station with a required output power, minimal battery consumption, and minimal spurious emissions. During operation, an RF PA's power dissipation generates high temperatures which can adversely affect key performance parameters of the RF PA such as linearity, power added efficiency (PAE), and gain.

To handle high-power requirements, an RF PA output stage normally uses an output array formed of similar device cells. However, due to thermal coupling between neighboring devices, such output arrays produce uneven thermal distribution across the output array. This uneven thermal distribution leads to reduced linearity and efficiency of the RF PA. Therefore, there is a need for RF PA output arrays having more even thermal distribution and improved linearity.

SUMMARY

Example embodiments provide a radio frequency (RF) power amplifier including a non-uniform segmented output array having non-uniform loading to provide more even thermal distribution and improved linearity.

In accordance with an example embodiment, a power amplifier output stage is provided. The power amplifier output stage includes a first output array group comprising a first plurality of semiconductor devices, a first loading adjustment module coupled to the first output array group, the first loading adjustment module being configured to adjust a loading of the first output array group to produce a first power dissipation value associated with the first output array group, a second output array group comprising a second plurality of semiconductor devices, and a second loading adjustment module coupled to the second output array group, the second loading adjustment module being configured to adjust a loading of the second output array group to produce a second power dissipation value associated with the second output array group.

Optionally, in any of the preceding embodiments, the first loading adjustment module includes a first source loading adjustment module coupled to a first input of the first output array group, the first source loading adjustment module being configured to adjust a source loading of the first output array group.

Optionally, in any of the preceding embodiments, the second loading adjustment module includes a second source loading adjustment module coupled to a second input of the second output array group, the second source loading adjustment module being configured to adjust a source loading of the second output array group.

Optionally, in any of the preceding embodiments, the first loading adjustment module includes a first output loading adjustment module coupled to a first output of the first output array group, the first output loading adjustment module being configured to adjust an output loading of the first output array group.

Optionally, in any of the preceding embodiments, the second loading adjustment module includes a second output loading adjustment module coupled to a second output of the second output array group, the second output loading adjustment module being configured to adjust an output loading of the second output array group.

Optionally, in any of the preceding embodiments, the power amplifier output stage further includes a first bias adjustment module coupled to the first output array group, the first bias adjustment module being configured to adjust a first bias value associated with the first output array group.

Optionally, in any of the preceding embodiments, adjusting of the first bias value further adjusts the first power dissipation value.

Optionally, in any of the preceding embodiments, the first bias value includes at least one of a voltage value or a current value.

Optionally, in any of the preceding embodiments, the power amplifier output stage further includes a second bias adjustment module coupled to the second output array group, the second bias adjustment module being configured to adjust a second bias value associated with the second output array group.

Optionally, in any of the preceding embodiments, adjusting of the second bias value further adjusts the second power dissipation value.

Optionally, in any of the preceding embodiments, the second bias value includes at least one of a voltage value or a current value.

Optionally, in any of the preceding embodiments, the first plurality of semiconductor devices and the second plurality of semiconductor devices each have a different number of semiconductor devices.

Optionally, in any of the preceding embodiments, the first plurality of semiconductor devices and the second plurality of semiconductor devices each have a same number of semiconductor devices.

Optionally, in any of the preceding embodiments, the power amplifier output stage further includes a third output array group comprising a third plurality of semiconductor devices, and a third loading adjustment module coupled to the third output array group, the third loading adjustment module being configured to adjust a loading of the third output array group to produce a third power dissipation value associated with the third output array group.

Optionally, in any of the preceding embodiments, the power amplifier further includes a third bias adjustment module coupled to the third output array group, the third bias adjustment module being configured to adjust a third bias value associated with the third output array group.

Optionally, in any of the preceding embodiments, the third power dissipation value is less than at least one of the first power dissipation value or the second power dissipation value.

In accordance with an example embodiment, a device includes a transceiver, and a power amplifier output stage coupled to the transceiver, the power amplifier output stage including a first output array group comprising a first plurality of semiconductor devices, a first loading adjustment module coupled to the first output array group, the first loading adjustment module being configured to adjust a loading of the first output array group to produce a first power dissipation value associated with the first output array group, a second output array group comprising a second plurality of semiconductor devices, and a second loading adjustment module coupled to the second output array group, the second loading adjustment module being configured to adjust a loading of the second output array group to produce a second power dissipation value associated with the second output array group.

Optionally, in any of the preceding embodiments, the first loading adjustment module includes a first source loading adjustment module coupled to a first input of the first output array group, the first source loading adjustment module being configured to adjust a source loading of the first output array group.

Optionally, in any of the preceding embodiments, the second loading adjustment module includes a second source loading adjustment module coupled to a second input of the second output array group, the second source loading adjustment module being configured to adjust a source loading of the second output array group.

Optionally, in any of the preceding embodiments, the first loading adjustment module includes a first output loading adjustment module coupled to a first output of the first output array group, the first output loading adjustment module being configured to adjust an output loading of the first output array group.

Optionally, in any of the preceding embodiments, the second loading adjustment module includes a second output loading adjustment module coupled to a second output of the second output array group, the second output loading adjustment module being configured to adjust an output loading of the second output array group.

Optionally, in any of the preceding embodiments, the device further includes a first bias adjustment module coupled to the first output array group, the first bias adjustment module being configured to adjust a first bias value associated with the first output array group.

Optionally, in any of the preceding embodiments, adjusting of the first bias value further adjusts the first power dissipation value.

Optionally, in any of the preceding embodiments, the first bias value includes at least one of a voltage value or a current value.

Optionally, in any of the preceding embodiments, the device further includes a second bias adjustment module coupled to the second output array group, the second bias adjustment module being configured to adjust a second bias value associated with the second output array group.

Optionally, in any of the preceding embodiments, adjusting of the second bias value further adjusts the second power dissipation value.

Optionally, in any of the preceding embodiments, the second bias value includes at least one of a voltage value or a current value.

Optionally, in any of the preceding embodiments, the first plurality of semiconductor devices and the second plurality of semiconductor devices each have a different number of semiconductor devices.

Optionally, in any of the preceding embodiments, the first plurality of semiconductor devices and the second plurality of semiconductor devices each have a same number of semiconductor devices.

Optionally, in any of the preceding embodiments, the device further includes a third output array group comprising a third plurality of semiconductor devices, the third output array group being positioned between the first output array group and the second output array group, and a third loading adjustment module coupled to the third output array group, the third loading adjustment module being configured to adjust a loading of the third output array group to produce a third power dissipation value associated with the first output array group.

Optionally, in any of the preceding embodiments, the device further includes a third bias adjustment module coupled to the third output array group, the third bias adjustment module being configured to adjust a third bias value associated with the third output array group.

Optionally, in any of the preceding embodiments, the third power dissipation value is less than at least one of the first power dissipation value or the second power dissipation value.

Optionally, in any of the preceding embodiments, the device comprises one of a user equipment (UE) or a base station.

In accordance with an example embodiment a power amplifier output stage includes a first output array group comprising a first plurality of semiconductor devices, a first output loading adjustment module coupled to a first output of the first output array group, the first output loading adjustment module being configured to adjust an output loading of the first output array group, a first source loading adjustment module coupled to a first input of the first output array, the first source loading adjustment module being configured to adjust a source loading of the first output array group, the adjusting of the output loading and the source loading of the first output array group producing a first power dissipation value associated with the first output array group, a second output array group comprising a second plurality of semiconductor devices, a second output loading adjustment module coupled to a second input of the second output array group, the second output loading adjustment module being configured to adjust an output loading of the second output array group, a second source loading adjustment module coupled to a second input of the second output array, the second source loading adjustment module being be configured to adjust a source loading of the second output array group, the adjusting of the output loading and the source loading of the second output array group producing a second power dissipation value associated with the second output array group.

Optionally, in any of the preceding embodiments, the power amplifier output stage further includes a first bias adjustment module coupled to the first output array group, the first bias adjustment module being configured to adjust a first bias value associated with the first output array group.

Optionally, in any of the preceding embodiments, adjusting of the first bias value further adjusts the first power dissipation value.

Optionally, in any of the preceding embodiments, the power amplifier output stage further includes a second bias adjustment module coupled to the second output array group, the second bias adjustment module being configured to adjust a second bias value associated with the second output array group.

Optionally, in any of the preceding embodiments, adjusting of the second bias value further adjusts the second power dissipation value.

In accordance with an example embodiment, a method includes adjusting a loading of a first output array group of a power amplifier output stage to produce a first power dissipation value associated with the first output array group, the first output array group comprising a first plurality of semiconductor devices, and adjusting a loading of a second output array group of the power amplifier to produce a second power dissipation value associated with the second output array group, the second output array group comprising a second plurality of semiconductor devices.

Optionally, in any of the preceding embodiments, adjusting the loading of the first output array group further comprises adjusting a source loading of the first output array group.

Optionally, in any of the preceding embodiments, adjusting the loading of the second output array group further comprises adjusting a source loading of the second output array group.

Optionally, in any of the preceding embodiments, adjusting the loading of the first output array group further comprises adjusting an output loading of the first output array group.

Optionally, in any of the preceding embodiments, adjusting the loading of the second output array group further comprises adjusting an output loading of the second output array group.

Optionally, in any of the preceding embodiments, the method further comprises adjusting a first bias value associated with the first output array group, wherein adjusting of the first bias value further adjusts the first power dissipation value.

Optionally, in any of the preceding embodiments, the first bias value includes at least one of a voltage value or a current value.

Optionally, in any of the preceding embodiments, adjusting a second bias value associated with the second output array group, wherein adjusting of the second bias value further adjusts the second power dissipation value.

Optionally, in any of the preceding embodiments, the second bias value includes at least one of a voltage value or a current value.

Practice of the foregoing embodiments provides a power amplifier including a non-uniform segmented output array having non-uniform loading having improved thermal and other RF performance.

BRIEF DESCRIPTION OF THE DRAWINGS

For a more complete understanding of the present disclosure, and the advantages thereof, reference is now made to the following descriptions taken in conjunction with the accompanying drawings, in which:

FIG. 10 illustrates an example communication system according to example embodiments described herein;

FIGS. 11A and 11B illustrate example devices that may implement the teachings according to this disclosure.

DETAILED DESCRIPTION OF ILLUSTRATIVE EMBODIMENTS

The making and using of the disclosed embodiments are discussed in detail below. It should be appreciated, however, that the present disclosure provides many applicable concepts that can be embodied in a wide variety of specific contexts. The specific embodiments discussed are merely illustrative of specific ways to make and use the embodiments, and do not limit the scope of the disclosure.

Figure 1:
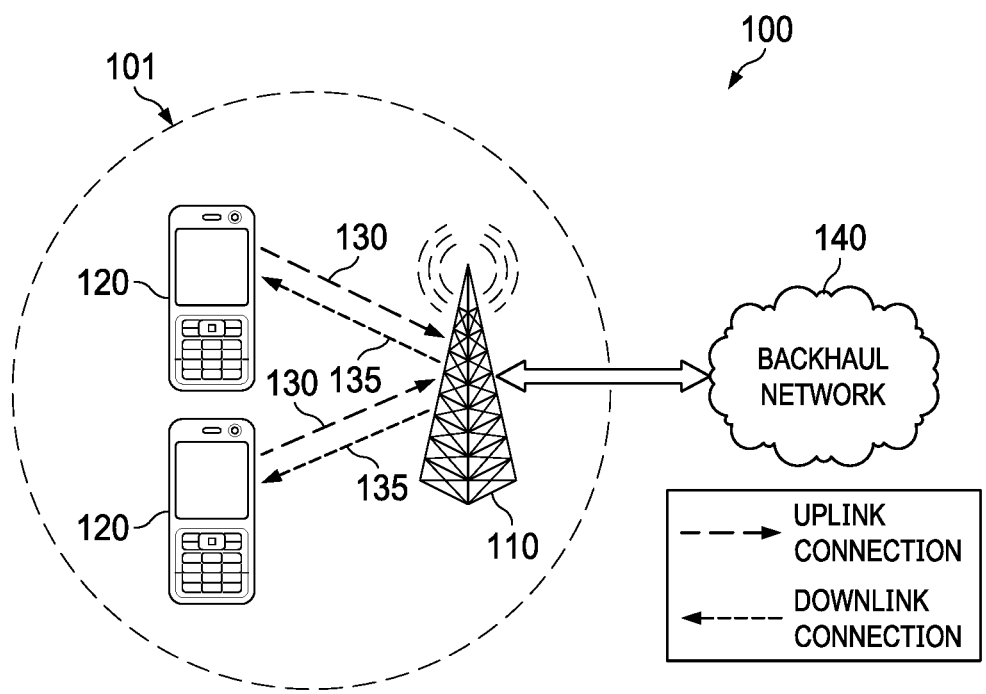
FIG. 1 illustrates an example wireless communications system.

FIG. 1 illustrates an example wireless communications system 100. Communications system 100 includes an access node 110 serving a user equipment (UE) 120 within a coverage area 101. In a first operating mode, communications to and from UE 120, using an uplink connection 130 and a downlink connection 135, respectively, pass through access node 110. In a second operating mode, communications to and from UE 120 do not pass through access node 110, however, access node 110 typically allocates resources used by UE 120 to communicate. Access nodes may also be commonly referred to as Node Bs, evolved Node Bs (eNBs), next generation (NG) Node Bs (gNBs), master eNBs (MeNBs), secondary eNBs (SeNBs), master gNBs (MgNBs), secondary gNBs (SgNBs), network controllers, control nodes, base stations, access points, transmission points (TPs), transmission-reception points (TRPs), cells, carriers, macro cells, femtocells, pico cells, and so on, while UEs may also be commonly referred to as mobile stations, mobiles, terminals, users, subscribers, stations, and the like. Access nodes may provide wireless access in accordance with one or more wireless communication protocols, e.g., the Third Generation Partnership Project (3GPP) long term evolution (LTE), LTE advanced (LTE-A), 5G, 5G LTE, 5G New Radio (NR), High Speed Packet Access (HSPA), Wi-Fi 802.11a/b/g/n/ac/ad/ax/ay, etc. The access node 110 may be in communication with a backhaul network 140. While it is understood that communications systems may employ multiple eNBs capable of communicating with a number of UEs, only one eNB and one UE are illustrated for simplicity.

As discussed above, a radio frequency (RF) power amplifier (PA) front end module is a critical component of the UE. To evaluate the performances of the RF PA, a few key parameters are used such as output power, gain, PAE (power added efficiency), linearity, adjacent channel power ratio (ACPR), error vector magnitude (EVM), and harmonics leakage. The performance of the RF PA directly determines the operating mode (e.g., 2G, 3G, 4G, 5G, Wi-Fi) that the UE can support, how long the battery of the UE can last, and the stability of the communication between the UE and other devices. When the RF PA is in operation, the power dissipation of the RF PA generates high temperatures and currents, for example 150 to 200 degrees Celsius (° C.) with over 2 amps (A) of current, under certain antenna operating conditions. High temperatures adversely affect the RF PA's key performance parameters such as linearity, PAE, gain, etc. High temperatures may also impact the UE's long-term reliability, dramatically reducing the UE's mean time to failure (MTTF).

To handle such high-power requirements, RF PA output stages typically use a uniformly distributed array of many identical semiconductor device cells. To minimize the uneven distribution of power across the output array, direct current (DC) ballasting is a standard technique used to attempt to prevent device thermal runaway, which is a catastrophic event. However, due to thermal coupling between neighboring devices of the output array, the output array inevitably ends up with uneven temperature distribution across the output array with typically substantially higher temperatures for devices in the middle of the output array, and lower temperatures for devices at the side ends of the output array. The temperature differences between the middle devices and side end devices of the output array may reach as much as 40° C. in some examples. In many aspects of performance of an RF PA, such as linearity, power saturation and reliability, devices in the middle of the output array are determinative factors in overall performance of the output array. Performance of a semiconductor device depends heavily upon its temperature, and each individual device in the array may perform differently due to uneven temperature distribution. For a linear RF amplifier, a device operating at higher temperature compresses the output signal earlier than a device operating at a lower temperature, thus becoming less linear as well as being less efficient, producing less gain, and more vulnerable in reliability.

An RF PA output stages includes many individual semiconductor devices ideally working as a united group to handle the power amplification task of the PA. Due to physical restrictions, without mitigation the output array will inevitably have uneven temperature distribution with much higher temperature for those individual devices the located in or near the center, or middle, of the output array.

The goals of achieving minimum power consumption while preserving excellent linearity with robust long-term reliability require an output stage with a thermal distribution that is as even as possible across the output stage. Accordingly, it is desirable to obtain an even thermal distribution across the output array at a target maximum output power while achieving an overall reduced temperature, improved linearity, an extended compression point, and improved long-term reliability as well as maintaining minimum power consumption.

One or more embodiments provide for a non-uniform segmented output array in which the semiconductor devices of the array are segmented into non-uniform groups of semiconductor devices, for example, having a different number, size, and/or type of semiconductor devices in each group. In embodiments, the semiconductor devices of the output array are divided into several semi-independent groups, for example, two side end groups and one middle group. The non-uniform segmented output array further includes tunable loading for each segment group.

The temperature of a semiconductor device is proportional to the power dissipated within the device, The power dissipation within the device depends upon a few key factors, such as the source loading, the output loading, and the bias received by the device. In embodiments, adjusting one or more of the source loading, the output loading, and the bias provided to each group of semiconductor devices allows controllable non-uniform (e.g., different) provision of power dissipated in each group. By segmenting the output array into non-uniformly distributed groups of semiconductor devices with non-uniform loading, device sizing, and/or input power, power dissipation in each group can be regulated in a controllable and tunable manner. Thus, power dissipated into each individual group can be controlled to compensate and counteract thermal coupling between devices to achieve relatively even temperature distribution with an overall reduction in temperature of the RF PA.

In an embodiment, one or more of the UEs 120 and/or access node 110 may include an RF PA output stage having a non-uniform segmented output array with non-uniform loading as further described herein with respect to one or more embodiments.

Figure 2:
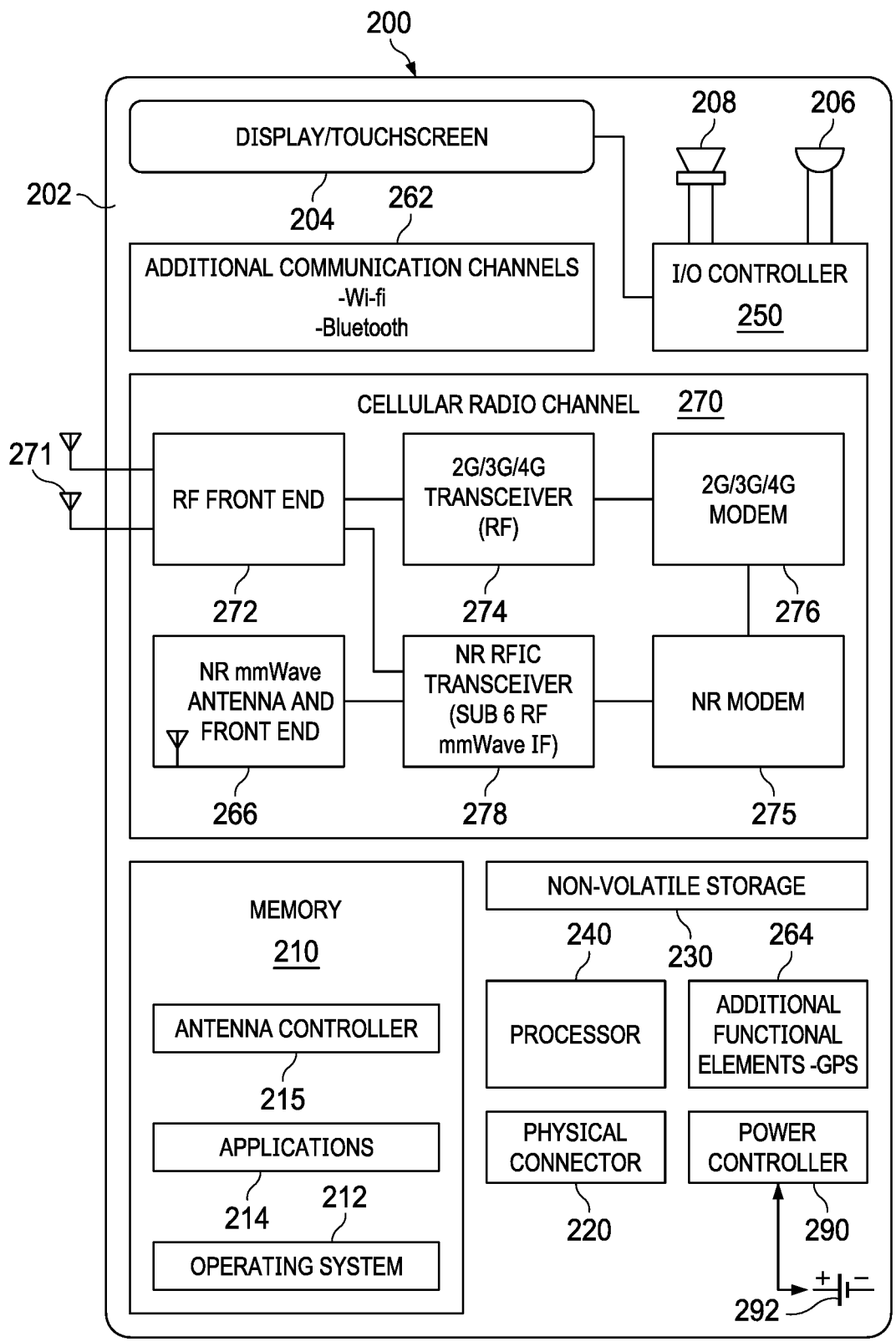
FIG. 2 illustrates an example of architecture for a UE in which the non-uniform segmented output array may be utilized.

FIG. 2 illustrates an example of architecture for a UE 200 in which the non-uniform segmented output array may be utilized. In a particular embodiment, the UE 200 is a 5G NR mobile processing device. The UE 200 has memory 210, a physical connector 220, processor 240, an input/output (I/O) controller 250, a cellular radio channel 270, and a power controller 290. Each of these components is connected through one or more system buses (not shown).

Memory 210, coupled to processor 240, includes the UE's operating system 212, applications 214, and an antenna controller 215. Memory 2210 can be any variety of memory storage media types, including non-volatile and volatile memory. The operating system 212 handles the different operations of the UE 200 and may contain user interfaces for operations, such as placing and receiving phone calls, text messaging, checking voicemail, and the like. The applications 214 can be any assortment of programs, such as a camera application for photos and/or videos, an address book application, a calendar application, a media player, an internet browser, games, and the like.

The operating system 212 manages the hardware of the UE 200, including hardware such as a display/touchscreen 240, a speaker 208, and a microphone 206. The operating system 212 also manages software (i.e. applications 214) on the UE 200 for performing tasks requested by the user and handling incoming data. This occurs through the operating system's control and allocation memory (i.e. RAM), system tasks, system resources, files systems, and the like. The processor 240 executes operations for the mobile processing device according to this control and allocation.

The power controller 290 of the UE 200 allocates power from the UE's power supply 292 to the circuitry for different mobile processing device components used to operate the UE 200 and its different features. Additionally, the physical connector 220 can be used to connect the UE 200 to an external power source, such as an AC adapter or powered docking station.

The cellular radio channel 270 is used for receiving and transmitting data, such as phone calls, text messages, email, webpage data, and the like. Cellular radio communication can occur through any of the standard network protocols of UE communication (i.e. GSM, PCS, D-AMPS, UMTS, CDMA, WCDMA, LTE, and the like). The UE 200 may also contain additional communication channels 262, such as Wi-Fi, Bluetooth, and the like, for receiving and transmitting data as well. The UE 200 may have additional functional elements for communication 264, such as GPS. Each of the described communication mediums is accessed via a mmWave and antenna front-end 266 or an RF front end 272 with antenna 271 on the UE 200. The communication mediums for operations of the UE 200 are not limited to the mediums described and can include any other communication mediums known in the art.

The cellular radio channel 270 is illustrated herein as a combination of legacy 2G/3G/4G subsystem and a 5G communication subsystem. It comprises a 2G/3G/4G modem 276, a 2G/3G/4G transceiver 274 (which may be embodied in an LTE RF integrated circuit (RFIC)) coupled to modem 276 and a sub-6 GHz RF front end 272. The 5G subsystem includes a NR modem 275 and a NR transceiver 278 coupled to NR modem 275 and antenna and front-end 266. The 2G/3G/4G subsystem provides communication services for compatibility with legacy systems.

A NR modem 275 provides and receives data in digital baseband via an NR transceiver 278. The digital baseband is provided to the NR Modem 275 by the processor 240 and processed for transmission through the mmWave and antenna front-end 266. Similarly, data is received by the mmWave and antenna front-end 266 and provided to the transceiver for conversion to baseband by the NR modem 275. NR modem 275 and 2G/3G/4G modem 276 share a connection to allow data to be provided through either channel if connectivity to NR frequencies is lost. The NR transceiver 278 transmits and receives data using either mmWave frequencies or legacy sub-6 GHz frequencies, or both, and is therefore connected to both the sub-6 GHz RF front end 272 and the mmWave and antenna front-end 266. In some implementations, 2G/3G/4G transceiver 274 and NR transceiver 278 can be physically combined into single chip or module, while 2G/3G/4G modem 276 and NR modem 275 can be physically combined into single chip or module.

The NR mmWave and antenna front-end 266 may include fixed beam antennas, phased array antennas or hybrid antenna arrays as described herein. Each front-end 266 may comprise one or multiple front-end modules (FEMs). Each module may include one or more steering beam phased array antennas, hybrid antenna arrays and one or more fixed beam antennas. In embodiments, the RF front end 266 and/or the mmWave and antenna front-end 266 include an RF PA output stage having a non-uniform segmented output array and/or non-uniform loading as further described herein.

It should be recognized that any suitable processing device, mobile or otherwise, may implement the PA output stage having a non-uniform segmented output array and/or non-uniform loading described herein. Hence, although FIG. 2 illustrates a UE, similar components to those illustrated in FIG. 2 may be provided in a communication device or a general-purpose processing device such as a desktop computer, laptop computer, or server.

Figure 3:
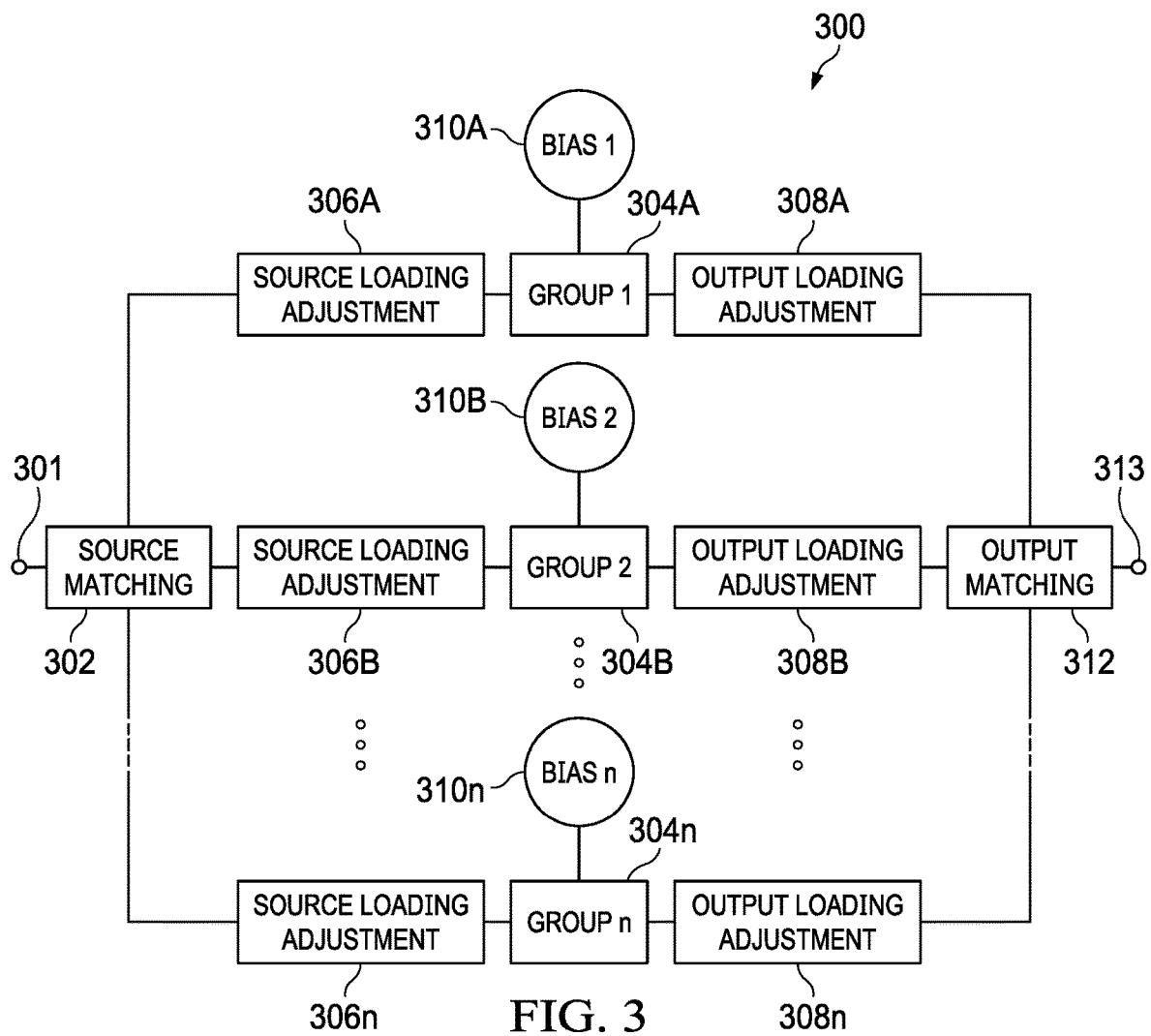
FIG. 3 illustrates a first example of a non-uniform segmented output array of a radio frequency power amplifier.

FIG. 3 illustrates a first example of a non-uniform segmented output array 300 of a radio frequency (RF) power amplifier (PA). The non-uniform segmented output array 300 includes a signal input 301 coupled to a source matching module 302. The signal input 301 is configured to receive an input signal to be amplified by the RF PA, and the source matching module 302 is configured to match an impendence of a source of the input signal to the non-uniform segmented output array 300. The non-uniform segmented output array 300 further includes multiple output array groups 304A-304N in which each of the output array groups 304A-304N are coupled in parallel to source matching module 302. Each output array group 304A-304N is comprised of an arrangement of semiconductor devices configured to provide power amplification to the input signal. One or more of the output array groups 304A-304N is non-uniform with respect to another of the output array groups 304A-304N. In particular embodiments, one or more of the output array groups 304A-304N have a different number of semiconductor devices, a different size of semiconductor devices, and/or a different type of semiconductor devices with respect to another of the output array groups 304A-304N.

The non-uniform segmented output array 300 further includes source loading adjustment modules 306A-306N coupled to a respective input of each of the output array groups 304A-304N. For example, a first source loading adjustment module 306A is coupled to an input of the first output array group 304A, a second source loading adjustment module 306B is coupled to an input of the second output array group 304B, and an N-th source loading adjustment module 306N is coupled to an input of the N-th output array group 304N. Each of the source loading adjustment modules 306A-306N is configured to adjust a source loading of the respective output array group 304A-304N to which it is coupled.

The non-uniform segmented output array 300 further includes output loading adjustment modules 308A-308N coupled to a respective output of each of the output array groups 304A-304N. For example, a first output loading adjustment module 308A is coupled to an output of the first output array group 304A, a second output loading adjustment module 308B is coupled to an output of the second output array group 304B, and an N-th source loading adjustment module 308N is coupled to an output of the N-th output array group 304N. Each of the output loading adjustment modules 308A-308N is configured to adjust an output loading of the respective output array group 304A-304N to which it is coupled.

The non-uniform segmented output array 300 further includes bias adjustment modules 310A-310N coupled to each of the output array groups 304A-304N. For example, a first bias adjustment module 310A is coupled to the first output array group 304A, a second bias adjustment module 310B is coupled to the second output array group 304B, and an N-th bias adjustment module 310N is coupled to an output of the N-th output array group 304N. Each of the bias adjustment modules 310A-310N is configured to adjust a bias value associated with the respective output array group 304A-304N to which it is coupled. In particular embodiments, the bias value includes one or more of a one of a bias voltage or a bias current. Each of the outputs of the output loading adjustment modules 308A-308N are coupled to an output matching module 312 configured to combine the individual outputs and provide an impedance matches amplified output signal 313.

During operation, each of the output array groups 304A-304N produces a particular power dissipation that is controllable by adjusting one or more of the source loading, output loading, and bias value associated with the respective output array group to achieve non-uniform controllable and tunable power dissipation in each of the output array groups 304A-304N.

The average power dissipated in each group per unit cell (Avg_Pdiss_group_per_unit_cell) may be determined by the formula:

Avg_Pdiss_group_per_unit_cell=(DC_power_flow_in+RF_power_flow_in−RF_power_flow_out)/(number of cells in group)

in which DC_power_flow_in is equal to the DC power flow into the group, RF_power_flow_in is equal to RF power flow into the group, and RF_power_flow_out is equal to the RF power flow out of the group.

In an example embodiment, output array groups 304A-304N are segmented into three output array groups including a first output array group 304A, a second output array group 304B, and a third output array group 304C having non-uniform loading, biasing, and/or sizing of the output array groups. In the example embodiment, the first output array group 304A and the third output array group 304C are side end groups, with the second output array group 304B being a center group disposed between the first output array group 304A and the third output array group 304C. Each of the output array groups 304A-304C is provided with semi-independent source loading and output loading, as well as an independent bias, allowing each group to be configured to allow the power dissipation of the group to be controllable and adjustable.

In the example embodiment, first and third (side end) output array groups 304A and 304C are assigned heavier loading and/or a different bias, while at the same time a lighter loading is assigned for the second (center) output array group 304B to produce non-uniform power dissipation (e.g., different power dissipation values) between the side end groups and center group to achieve a more evenly thermally distributed output array. For example, a power dissipation value associated with the first output array group 304A and/or the third output array group 304C may be less than a power dissipation value associated with the second output array group 304B. By adjusting source loading, output loading, biasing, sizing, and/or ballasting for each device group, the average power dissipated in each group per unit cell (Avg_Pdiss_group_per_unit_cell) can be adjusted to compensate for thermal coupling between devices to improve the thermal dissipation across the output array. Accordingly, by adjusting the power dissipation for each of the output array groups 304A-304C, non-uniform controllable and tunable power dissipation may be achieved to compensate for strong thermal coupling effects that result from center devices typically having higher temperatures than outer devices.

Figure 4:
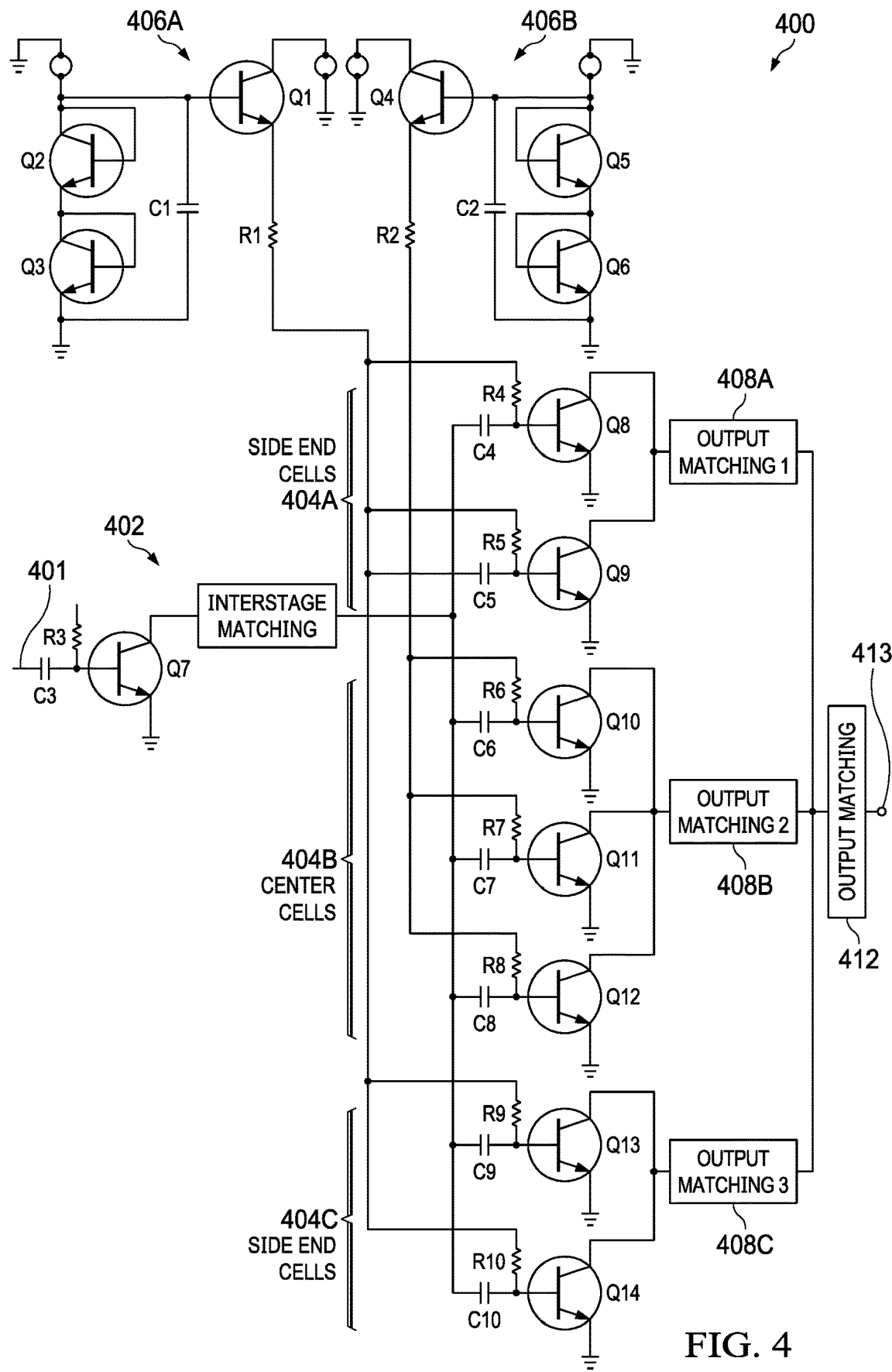
FIG. 4 illustrates a second example of a non-uniform segmented output array of an radio frequency power amplifier.

FIG. 4 illustrates a second example of a non-uniform segmented output array 400 of an RF PA. In the example of FIG. 4, the non-uniform segmented output array includes a number of transistor devices, such as heterojunction bipolar transistor (HBT) transistor devices. The non-uniform segmented output array 400 includes a signal input 401 configured to receive an input signal to be amplified and coupled to a source matching circuit 402 having an interstage matching module. The source matching circuit 402 is coupled to inputs of a first output array group 404A, a second output array group 404B, and a third output array group 404C. Capacitive devices C4 and C5 are elements for adjusting the source loading to first output array group 404A, capacitive devices C6, C7, and C8 are elements for adjusting the source loading to second output array group 404B, and capacitive devices C9 and C10 are elements to adjust the source loading to third output array group 404C. The second output array group 404B is disposed between the first output array group 404A and the third output array group 404C. The first output array group 404A is formed of two side end cells including two transistor devices Q8 and Q9, respectively. The second output array group 404B is formed of three center cells including three transistor devices Q10, Q11, and Q12. The third output array group 404C is formed of two side end cells including two transistor devices Q13 and Q14, respectively. Accordingly, the second output array group 404B is non-uniform with respect to the first output array group 404A and the second output array group 404C due to having a different number of transistor devices and different values of source loading adjustment elements.

The non-uniform segmented output array 400 further includes a first bias adjustment circuit 406A coupled to the first output array group 404A and the third output array group 404C, and a second bias adjustment circuit 406B coupled to the second output array group 404B. The first bias adjustment circuit 406A includes transistors Q1, Q2, and Q3, and the second bias adjustment circuit 406B includes transistors Q4, Q5, and Q6. The first bias adjustment circuit 406A is configured to provide a first bias value to each of the transistors Q8 and Q9 of the first output array group 404A, and each of the transistors Q13 and Q14 of the third output array group 404C. The second bias adjustment circuit 406B is configured to provide a second bias value to the transistors Q10, Q11, and Q12 of the second output array group 404B. In one or more embodiments, the first bias value and the second bias value are one of a bias voltage or a bias current. In a particular embodiment, the first bias value applied to the first output array group 404A and the third output array group 404C is a different value from the second bias value applied to the second output array group 404B.

Outputs of the individual transistors Q8 and Q8 of the first output array group 404A are coupled to an input of a first output loading adjustment module 408A, outputs of the individual transistors Q10, Q11, and Q12 of the second output array group 404B are coupled to an input of a second output loading adjustment module 408B, and outputs of the individual transistors Q13 and Q14 of the third output array group 404C are coupled to an input of a third output loading adjustment module 408C. Each of the first output loading adjustment module 408A, the second output loading adjustment module 408B, and the third output loading adjustment module 408C are configured to adjust the source loading of the respective output array groups 404A-404C. Outputs of each of the first output loading adjustment module 408A, the second output loading adjustment module 408B, and the third output loading adjustment module 408C are coupled to an input of an output matching module 412. The output matching module 412 is configured to combine the respective outputs of output array groups 404A-404C and provide an impedance matched output signal 413.

Although the particular embodiment illustrated in FIG. 4 includes the first bias adjustment circuit 406A and the second bias adjustment circuit 406B being used to adjust the bias of the output array groups 404A-404C, it should be understood that in other embodiments, the non-uniform segmented output array 400 may further include one or more source loading adjustment circuits and/or output loading adjustment circuits to adjust the source loading and/or output loading of each of output array groups 404A-404C to provide non-uniform controllable and tunable power dissipation.

Figure 5:
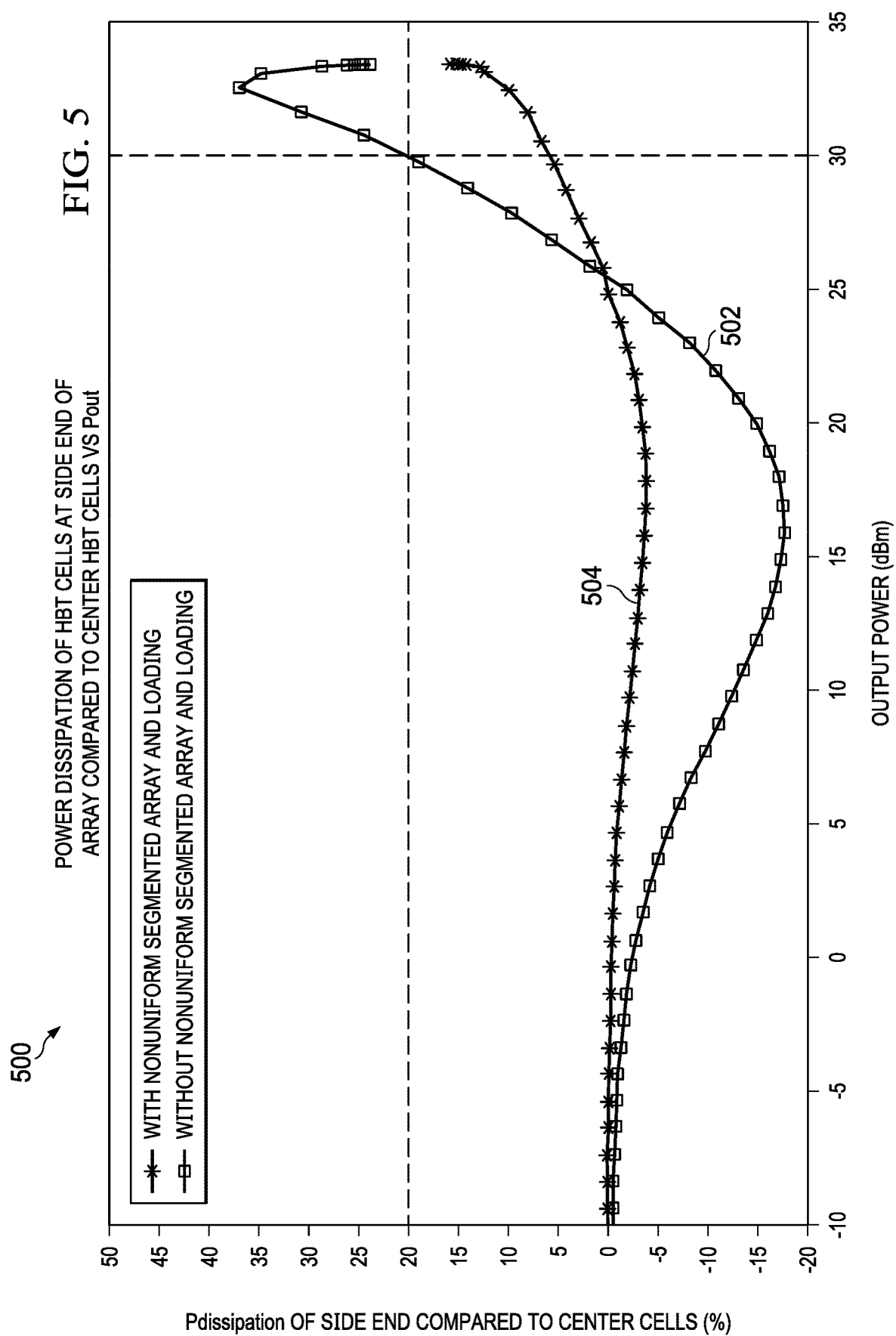
FIG. 5 is an example graph of simulation results of power dissipation of hetero-bipolar transistor (HBT) side end cells compared to center HBT cells of an output array versus output power.

FIG. 5 is an example graph 500 of simulation results of power dissipation of heterojunction bipolar transistor (HBT) side end cells compared to center HBT cells of an output array versus output power. An x-axis of graph 500 indicates output power (Pout) of the output array, and a Y-axis of graph 500 indicates a percentage difference in power dissipation of side end cells compared to center cells of the output array. FIG. 5 includes a plot 502 for a non-uniform segmented output array with non-uniform loading as described herein with respect to one or more embodiments, and a plot 504 for an output array without non-uniform segmentation and loading. As discussed above, it is desired to have a higher power dissipation inside the end device groups as compared to center device groups of an output array. As shown in the example of FIG. 5, an approximately 20% higher power dissipation may be achieved in the side end device group as compared to the center device group to counteract and compensate for stronger thermal coupling in the center device group.

Figure 6:
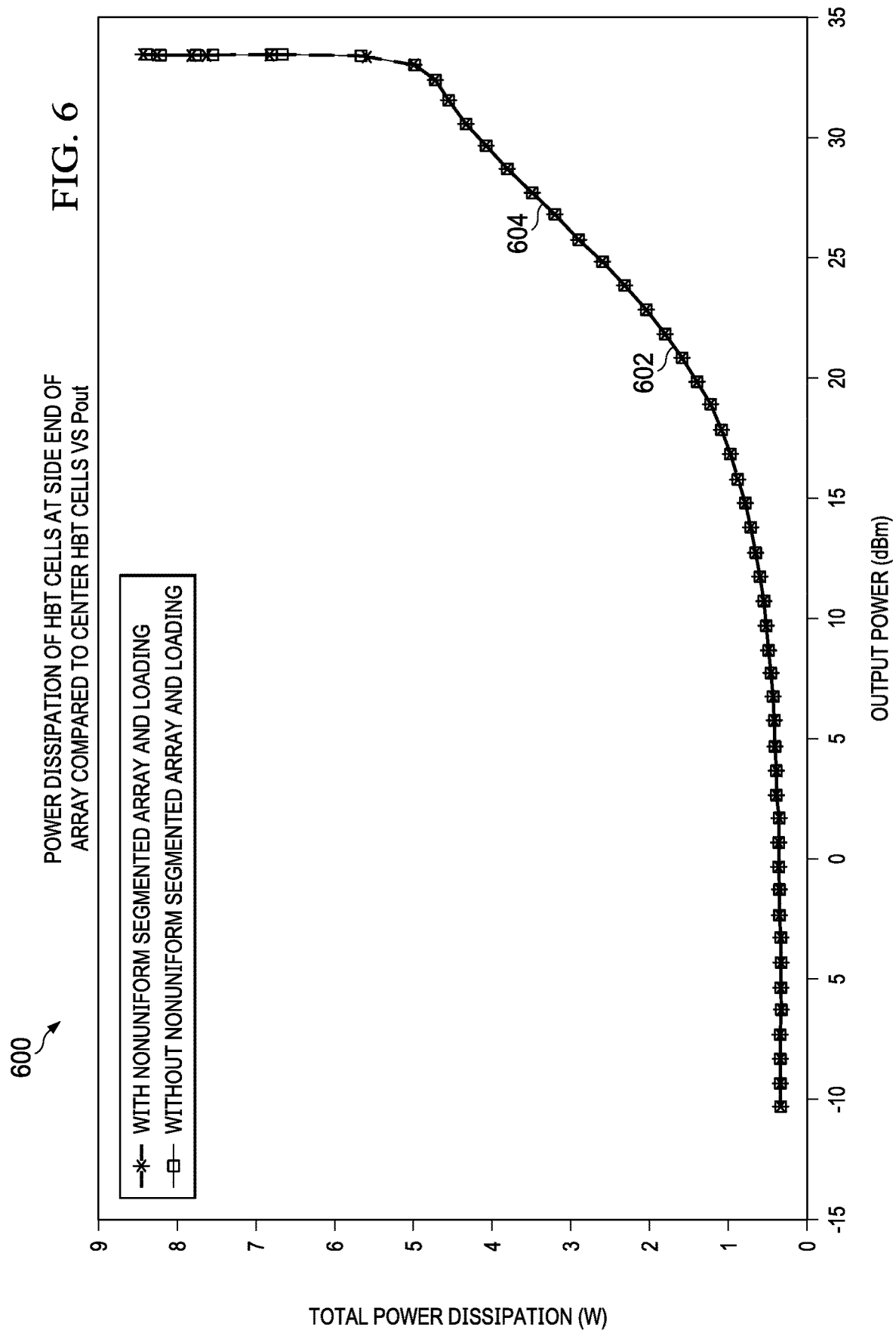
FIG. 6 is an example graph of simulation results of total power dissipation in an output array versus total power output.

FIG. 6 is an example graph 600 of simulation results of total power dissipation in an output array versus total power output. An x-axis of graph 600 indicates output power (Pout) of the output array, and a Y-axis of graph 600 indicates total power dissipation within the output array. FIG. 6 includes a plot 602 for a non-uniform segmented output array with non-uniform loading as described herein with respect to one or more embodiments, and a plot 604 for an output array without non-uniform segmentation and loading. As shown in the example of FIG. 6, total power dissipation within an output array may remain substantially unchanged between using a non-uniform segmented output array with non-uniform loading as compared to an output array having uniform segmentation and loading.

Figure 7:
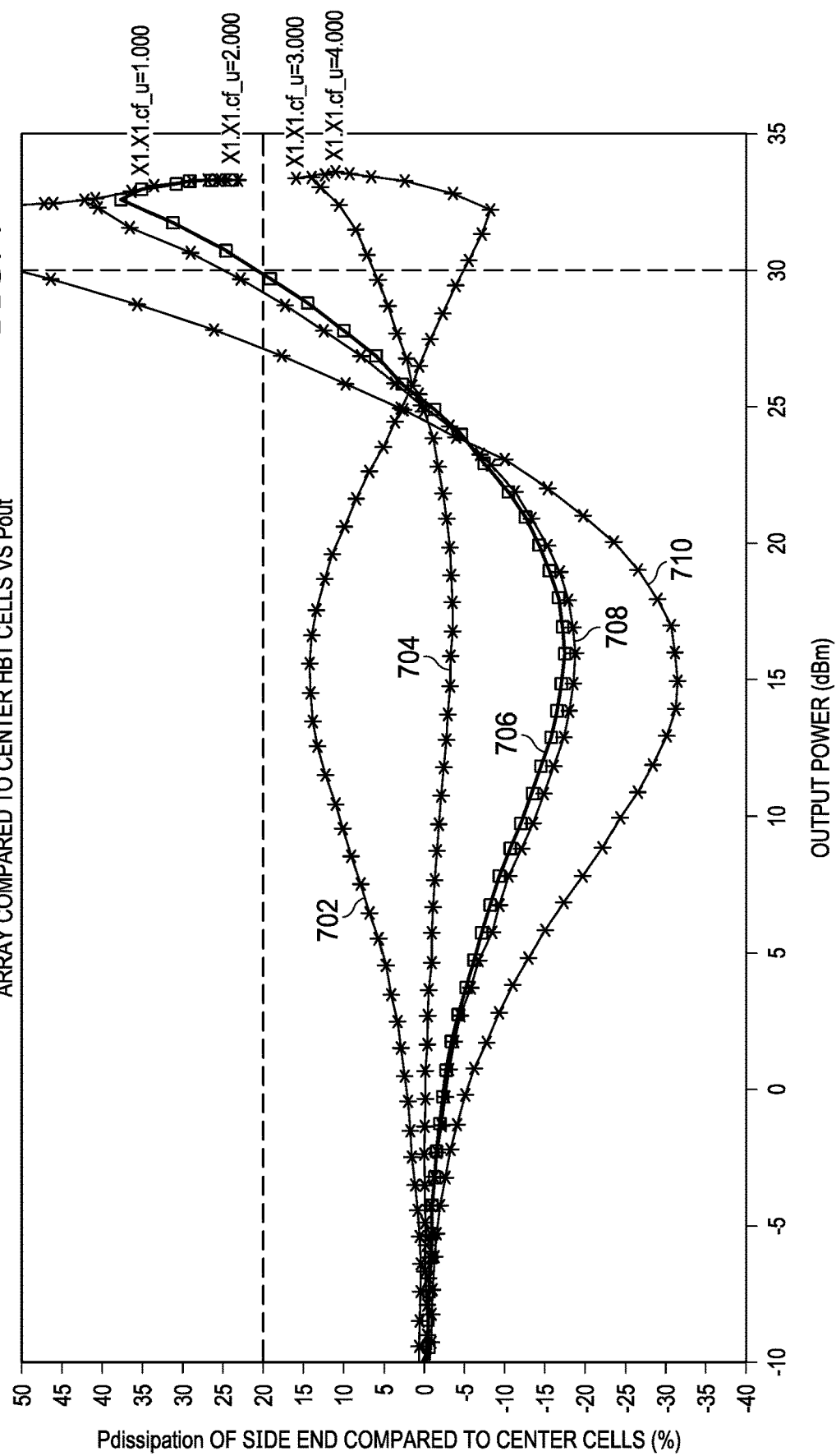
FIG. 7 is an example graph of simulation results of effects due to source loading adjustment on power dissipation.

FIG. 7 is an example graph 700 of simulation results of effects due to source loading adjustment on power dissipation of HBT side end cells compared to center HBT cells of an output array versus output power. An x-axis of graph 700 indicates output power (Pout) of the output array, and a Y-axis of graph 700 indicates a percentage difference in power dissipation of side end cells compared to center cells of the output array. FIG. 7 includes plots of different source loading values representative of a difference in source loading between side end cells and center cells. FIG. 7 includes a plot 702 of a source loading value=4.0, a plot 704 of a source loading value=3.0, a plot 706 of a source loading value=2.0, and a plot 708 of a source loading value=1.0, and a plot 710 of a source loading value=0.0. As illustrated in FIG. 7, power dissipation within each group can be controlled via adjustment of source loading to different device groups.

Figure 8:
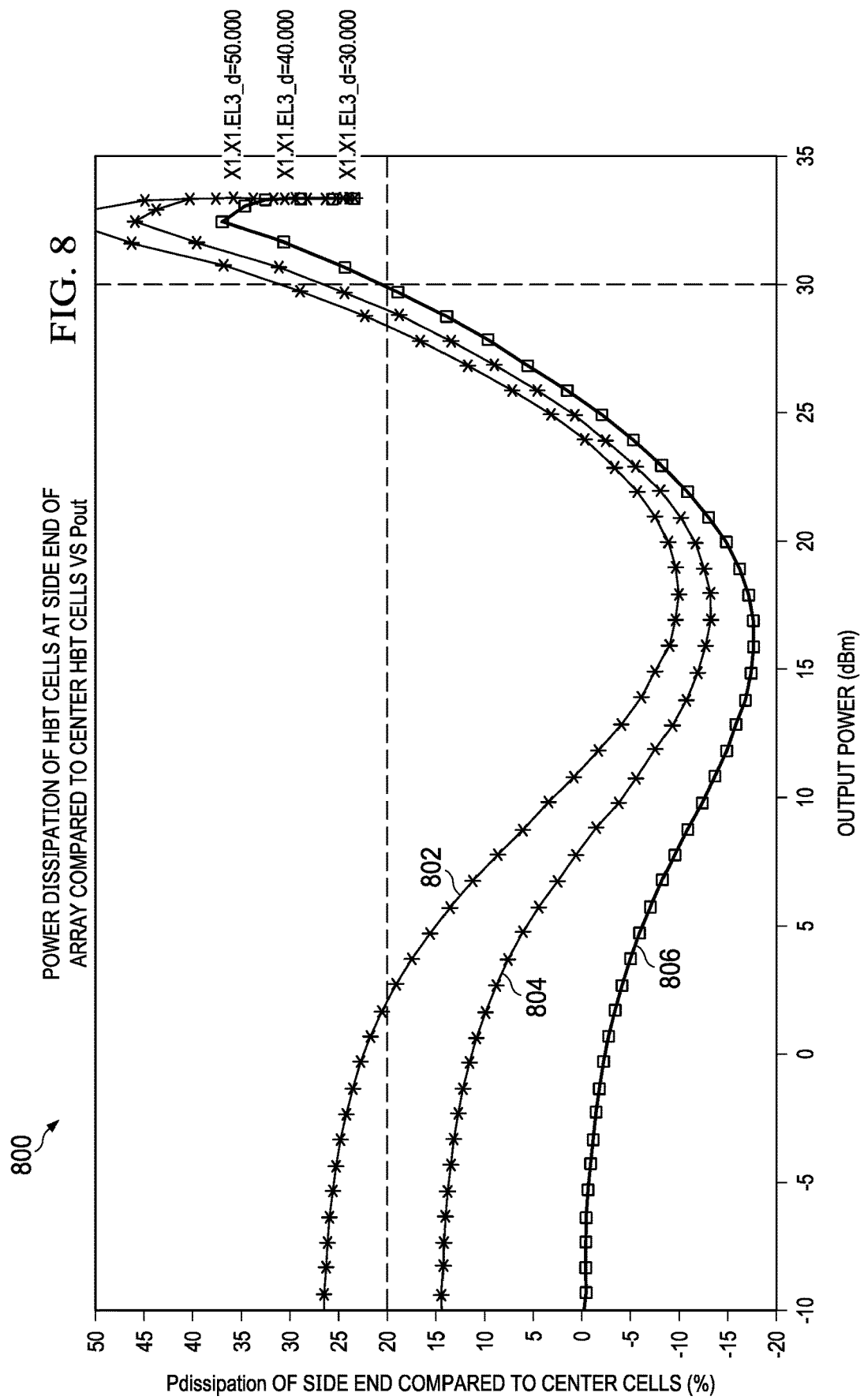
FIG. 8 is an example graph of simulation results of effects due to device sizing adjustment on power dissipation.

FIG. 8 is an example graph 800 of simulation results of effects due to device sizing adjustment on power dissipation of HBT side end cells compared to center HBT cells of an output array versus output power. An x-axis of graph 800 indicates output power (Pout) of the output array, and a Y-axis of graph 800 indicates a percentage difference in power dissipation of side end cells compared to center cells of the output array. FIG. 8 includes plots of different device size values representative of a difference in device sizes between side end cells and center cells. In particular embodiments, the difference in device sizes is representative of a number of HBT cells forming the respective device group. FIG. 8 includes a plot 802 of a device size value=50, a plot 804 of a device size value=40, a plot 806 of a device size value=30. As illustrated in FIG. 8, power dissipation within each group can be controlled via adjustment of device sizes of different device groups.

Figure 9:
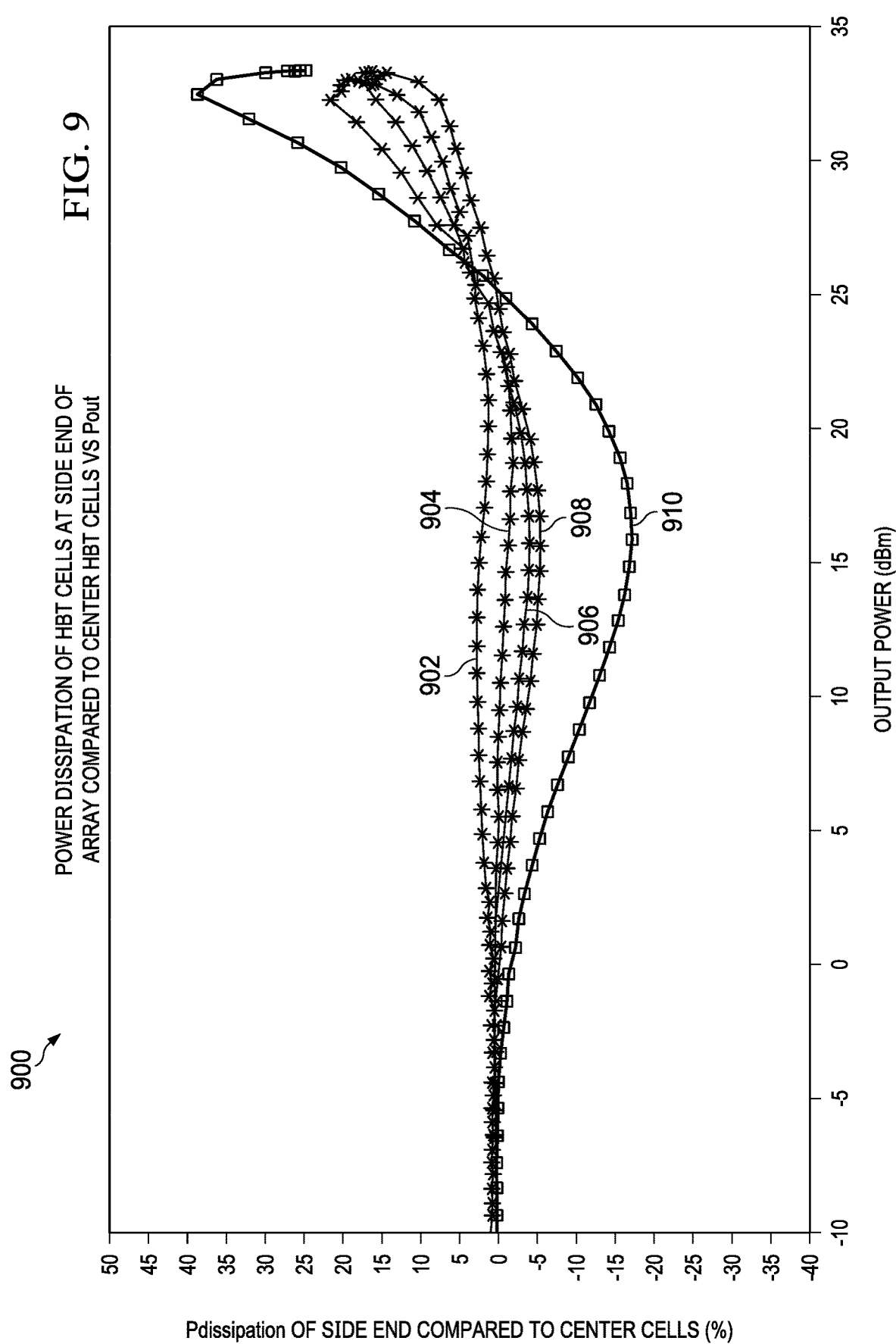
FIG. 9 is an example graph of simulation results of effects due to output loading adjustment on power dissipation.

FIG. 9 is an example graph 900 of simulation results of effects due to output loading adjustment on power dissipation of HBT side end cells compared to center HBT cells of an output array versus output power. An x-axis of graph 900 indicates output power (Pout) of the output array, and a Y-axis of graph 900 indicates a percentage difference in power dissipation of side end cells compared to center cells of the output array. FIG. 9 includes plots of different output loading values representative of a difference in output loading between side end cells and center cells. FIG. 9 includes a plot 902 of an output loading value=1.0, a plot 904 of an output loading value=1.5, a plot 906 of an output loading value=2.0, and a plot 908 of an output loading value=2.5, and a plot 910 of a source loading value=3.0. As illustrated in FIG. 9, power dissipation within each group can be controlled via adjustment of output loading to different device groups.

Accordingly, FIGS. 5-9 illustrate that power dissipation within each side end cell group and center cell group may be successfully redistributed in a controlled manner without a change in total power dissipation for the output array by adjusting source loading, output loading, bias, and/or device sizing of each group.

One or more embodiments described herein provide for a non-uniformly grouped output array with semi-independent adjustable source and/or output loading, non-uniform biasing and/or non-uniform device sizing as compared to typical uniform output arrays to compensate for strong thermal coupling for devices in the middle of the output array to achieve a more even thermal distribution across the output array. One or more embodiments provide for thermal coupling compensation in RF PA output stages to achieve more even thermal distribution across the output array without an increase in total power dissipation. As a result, improved RF performance such as increased linearity, increased gain over temperature, and enhanced long-term device reliability can be achieved.

FIG. 10 illustrates an example communication system 1000. In general, the system 1000 enables multiple wireless or wired users to transmit and receive data and other content. The system 1000 may implement one or more channel access methods, such as code division multiple access (CDMA), time division multiple access (TDMA), frequency division multiple access (FDMA), orthogonal FDMA (OFDMA), single-carrier FDMA (SC-FDMA), or non-orthogonal multiple access (NOMA).

In this example, the communication system 1000 includes electronic devices (ED) 1010*a*-1010*c*, radio access networks (RANs) 1020*a*-1020*b*, a core network 1030, a public switched telephone network (PSTN) 1040, the Internet 1050, and other networks 1060. While certain numbers of these components or elements are shown in FIG. 10, any number of these components or elements may be included in the system 1000.

The EDs 1010*a*-1010*c* are configured to operate or communicate in the system 1000. For example, the EDs 1010*a*-1010*c* are configured to transmit or receive via wireless or wired communication channels. Each ED 1010*a*-1010*c* represents any suitable end user device and may include such devices (or may be referred to) as a user equipment or device (UE), wireless transmit or receive unit (WTRU), mobile station, fixed or mobile subscriber unit, cellular telephone, personal digital assistant (PDA), smartphone, laptop, computer, touchpad, wireless sensor, or consumer electronics device. Each ED 1010*a*-1010*c* may include a transceiver having an RF PA with a non-uniform output array as described herein with respect to one or more embodiments.

The RANs 1020*a*-1020*b* here include base stations 1070*a*-1070*b*, respectively. Each base station 1070*a*-1070*b* is configured to wirelessly interface with one or more of the EDs 1010*a*-1010*c* to enable access to the core network 1030, the PSTN 1040, the Internet 1050, or the other networks 1060. For example, the base stations 1070a-1070b may include (or be) one or more of several well-known devices, such as a base transceiver station (BTS), a Node-B (NodeB), an evolved NodeB (eNodeB), a Next Generation (NG) NodeB (gNB), a Home NodeB, a Home eNodeB, a site controller, an access point (AP), or a wireless router. The base stations 1070a-1070b may each include a transceiver having an RF PA with a non-uniform output array as described herein with respect to one or more embodiments. The EDs 1010a-1010c are configured to interface and communicate with the Internet 1050 and may access the core network 1030, the PSTN 1040, or the other networks 1060.

In the embodiment shown in FIG. 10, the base station 1070a forms part of the RAN 1020a, which may include other base stations, elements, or devices. Also, the base station 1070b forms part of the RAN 1020b, which may include other base stations, elements, or devices. Each base station 1070a-1070b operates to transmit or receive wireless signals within a particular geographic region or area, sometimes referred to as a "cell." In some embodiments, multiple-input multiple-output (MIMO) technology may be employed having multiple transceivers for each cell.

The base stations 1070a-1070b communicate with one or more of the EDs 1010a-1010c over one or more air interfaces 1090 using wireless communication links. The air interfaces 1090 may utilize any suitable radio access technology.

It is contemplated that the system 1000 may use multiple channel access functionality, including such schemes as described above. In particular embodiments, the base stations and EDs implement 5G New Radio (NR), LTE, LTE-A, or LTE-B. Of course, other multiple access schemes and wireless protocols may be utilized.

The RANs 1020a-1020b are in communication with the core network 1030 to provide the EDs 1010a-1010c with voice, data, application, Voice over Internet Protocol (VoIP), or other services. Understandably, the RANs 1020a-1020b or the core network 1030 may be in direct or indirect communication with one or more other RANs (not shown). The core network 1030 may also serve as a gateway access for other networks (such as the PSTN 1040, the Internet 1050, and the other networks 1060). In addition, some or all of the EDs 1010a-1010c may include functionality for communicating with different wireless networks over different wireless links using different wireless technologies or protocols. Instead of wireless communication (or in addition thereto), the EDs may communicate via wired communication channels to a service provider or switch (not shown), and to the Internet 1050.

Although FIG. 10 illustrates one example of a communication system, various changes may be made to FIG. 10. For example, the communication system 1000 could include any number of EDs, base stations, networks, or other components in any suitable configuration.

FIGS. 11A and 11B illustrate example devices that may implement the methods and teachings according to this disclosure. In particular, FIG. 11A illustrates an example ED 1110, and FIG. 11B illustrates an example base station 1170. These components could be used in the system 1000 or in any other suitable system.

As shown in FIG. 11A, the ED 1110 includes at least one processing unit 1100. The processing unit 1100 implements various processing operations of the ED 1110. For example, the processing unit 1100 could perform signal coding, data processing, power control, input/output processing, or any other functionality enabling the ED 1110 to operate in the system 1000. The processing unit 1100 also supports the methods and teachings described in more detail above. Each processing unit 1100 includes any suitable processing or computing device configured to perform one or more operations. Each processing unit 1100 could, for example, include a microprocessor, microcontroller, digital signal processor, field programmable gate array, or application specific integrated circuit.

The ED 1110 also includes at least one transceiver 1102. The transceiver 1102 is configured to modulate data or other content for transmission by at least one antenna or NIC (Network Interface Controller) 1104. The transceiver 1102 is also configured to demodulate data or other content received by the at least one antenna 1104. Each transceiver 1102 includes any suitable structure for generating signals for wireless or wired transmission or processing signals received wirelessly or by wire. Each transceiver 1102 may include an RF PA with a non-uniform output array as described herein with respect to one or more embodiments. Each antenna 1104 includes any suitable structure for transmitting or receiving wireless or wired signals. One or multiple transceivers 1102 could be used in the ED 1110, and one or multiple antennas 1104 could be used in the ED 1110. Although shown as a single functional unit, a transceiver 1102 could also be implemented using at least one transmitter and at least one separate receiver.

The ED 1110 further includes one or more input/output devices 1106 or interfaces (such as a wired interface to the Internet 1050). The input/output devices 1106 facilitate interaction with a user or other devices (network communications) in the network. Each input/output device 1106 includes any suitable structure for providing information to or receiving information from a user, such as a speaker, microphone, keypad, keyboard, display, or touch screen, including network interface communications.

In addition, the ED 1110 includes at least one memory 1108. The memory 1108 stores instructions and data used, generated, or collected by the ED 1110. For example, the memory 1108 could store software or firmware instructions executed by the processing unit(s) 1100 and data used to reduce or eliminate interference in incoming signals. Each memory 1108 includes any suitable volatile or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

As shown in FIG. 11B, the base station 1170 includes at least one processing unit 1150, at least one transceiver 1152, which includes functionality for a transmitter and a receiver, one or more antennas 1156, at least one memory 1158, and one or more input/output devices or interfaces 1166. A scheduler, which would be understood by one skilled in the art, is coupled to the processing unit 1150. The scheduler could be included within or operated separately from the base station 1170. The processing unit 1150 implements various processing operations of the base station 1170, such as signal coding, data processing, power control, input/output processing, or any other functionality. The processing unit 1150 can also support the methods and teachings described in more detail above. Each processing unit 1150 includes any suitable processing or computing device configured to perform one or more operations. Each processing unit 1150 could, for example, include a microprocessor, microcontroller, digital signal processor, field programmable gate array, or application specific integrated circuit.

Each transceiver 1152 includes any suitable structure for generating signals for wireless or wired transmission to one or more EDs or other devices. Each transceiver 1152 further includes any suitable structure for processing signals received wirelessly or by wire from one or more EDs or other devices. Each transceiver 1152 may include an RF PA with a non-uniform output array as described herein with respect to one or more embodiments. Although shown combined as a transceiver 1152, a transmitter and a receiver could be separate components. Each antenna 1156 includes any suitable structure for transmitting or receiving wireless or wired signals. While a common antenna 1156 is shown here as being coupled to the transceiver 1152, one or more antennas 1156 could be coupled to the transceiver(s) 1152, allowing separate antennas 1156 to be coupled to the transmitter and the receiver if equipped as separate components. Each memory 1158 includes any suitable volatile or non-volatile storage and retrieval device(s). Each input/output device 1166 facilitates interaction with a user or other devices (network communications) in the network. Each input/output device 1166 includes any suitable structure for providing information to or receiving/providing information from a user, including network interface communications.

Figure 12:
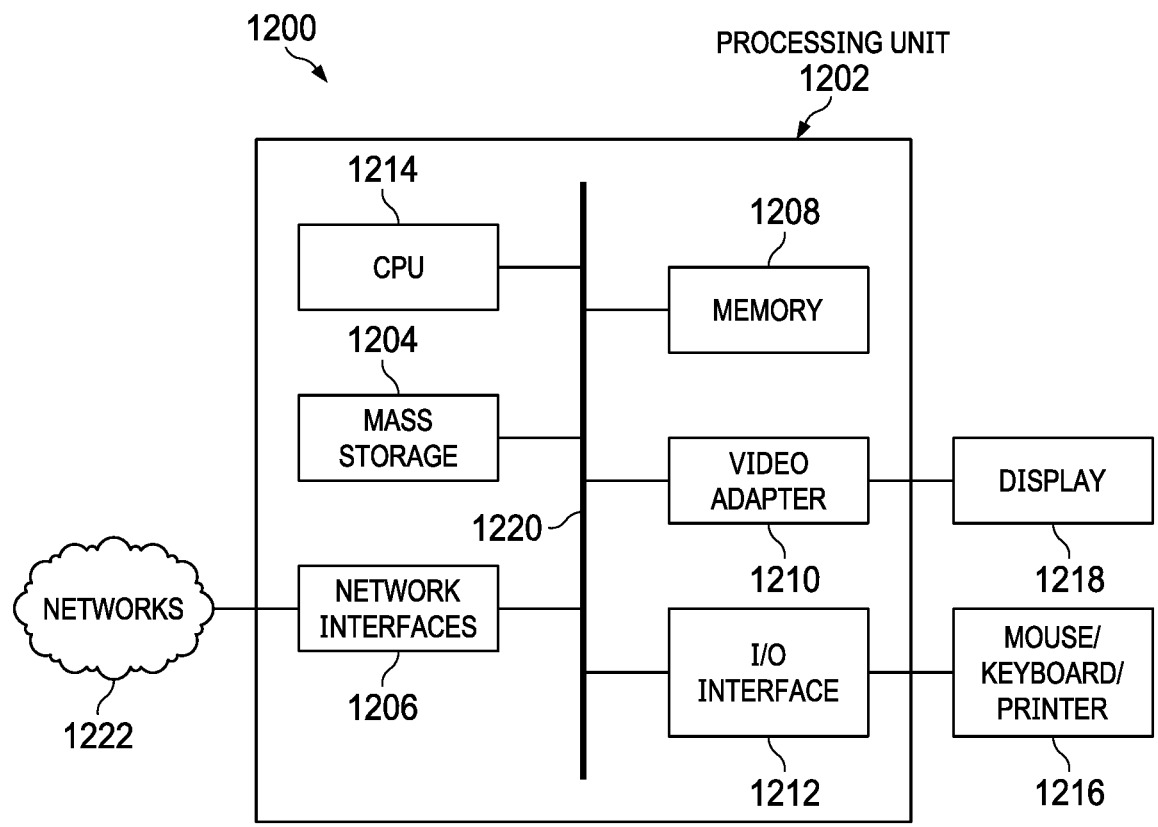
FIG. 12 is a block diagram of a computing system that may be used for implementing the devices disclosed herein.

FIG. 12 is a block diagram of a computing system 1200 that may be used for implementing the devices and methods disclosed herein. For example, the computing system can be any entity of UE, access network (AN), mobility management (MM), session management (SM), user plane gateway (UPGW), or access stratum (AS). Specific devices may utilize all of the components shown or only a subset of the components, and levels of integration may vary from device to device. Furthermore, a device may contain multiple instances of a component, such as multiple processing units, processors, memories, transmitters, receivers, etc. The computing system 1200 includes a processing unit 1202. The processing unit includes a central processing unit (CPU) 1214, memory 1208, and may further include a mass storage device 1204, a video adapter 1210, and an I/O interface 1212 connected to a bus 1220.

The bus 1220 may be one or more of any type of several bus architectures including a memory bus or memory controller, a peripheral bus, or a video bus. The CPU 1214 may comprise any type of electronic data processor. The memory 1208 may comprise any type of non-transitory system memory such as static random access memory (SRAM), dynamic random access memory (DRAM), synchronous DRAM (SDRAM), read-only memory (ROM), or a combination thereof. In an embodiment, the memory 1208 may include ROM for use at boot-up, and DRAM for program and data storage for use while executing programs.

The mass storage 1204 may comprise any type of non-transitory storage device configured to store data, programs, and other information and to make the data, programs, and other information accessible via the bus 1220. The mass storage 1204 may comprise, for example, one or more of a solid state drive, hard disk drive, a magnetic disk drive, or an optical disk drive.

The video adapter 1210 and the I/O interface 1212 provide interfaces to couple external input and output devices to the processing unit 1202. As illustrated, examples of input and output devices include a display 1218 coupled to the video adapter 1210 and a mouse, keyboard, or printer 1216 coupled to the I/O interface 1212. Other devices may be coupled to the processing unit 1202, and additional or fewer interface cards may be utilized. For example, a serial interface such as Universal Serial Bus (USB) (not shown) may be used to provide an interface for an external device.

The processing unit 1202 also includes one or more network interfaces 1206, which may comprise wired links, such as an Ethernet cable, or wireless links to access nodes or different networks. The network interfaces 1206 allow the processing unit 1202 to communicate with remote units via the networks. For example, the network interfaces 1206 may provide wireless communication via one or more transmitters/transmit antennas and one or more receivers/receive antennas. In an embodiment, the processing unit 1202 is coupled to a local-area network 1222 or a wide-area network for data processing and communications with remote devices, such as other processing units, the Internet, or remote storage facilities.

It should be appreciated that one or more steps of the embodiment methods provided herein may be performed by corresponding units or modules. For example, a signal may be transmitted by a transmitting unit or a transmitting module. A signal may be received by a receiving unit or a receiving module. A signal may be processed by a processing unit or a processing module. The respective units or modules may be hardware, software, or a combination thereof. For instance, one or more of the units or modules may be an integrated circuit, such as field programmable gate arrays (FPGAs) or application-specific integrated circuits (ASICs).

Although the present disclosure and its advantages have been described in detail, it should be understood that various changes, substitutions and alterations can be made herein without departing from the spirit and scope of the disclosure as defined by the appended claims.

What is claimed is:

1. A power amplifier output stage comprising:
   a first output array group comprising a first plurality of semiconductor devices;
   a first loading adjustment circuit coupled to the first output array group, the first loading adjustment circuit being configured to adjust a first loading of the first output array group to produce a first power dissipation value associated with the first output array group;
   a second output array group comprising a second plurality of semiconductor devices; and
   a second loading adjustment circuit coupled to the second output array group, the second loading adjustment circuit being configured to adjust a second loading of the second output array group to produce a second power dissipation value associated with the second output array group,
   wherein the first loading adjustment circuit adjusts the first loading to produce the first power dissipation value associated with the first output array group and the second loading adjustment circuit adjusts the second loading to produce the second power dissipation value associated with the second output array group to compensate for thermal coupling such that more even thermal distribution across the first output array group and the second output array group is achieved.

2. The power amplifier output stage of claim 1, wherein the first loading adjustment circuit includes a first source loading adjustment circuit coupled to a first input of the first output array group, the first source loading adjustment circuit being configured to adjust a first source loading of the first output array group.

3. The power amplifier output stage of claim 1, wherein the second loading adjustment circuit includes a second source loading adjustment circuit coupled to a second input of the second output array group, the second source loading adjustment circuit being configured to adjust a second source loading of the second output array group.

4. The power amplifier output stage of claim 1, wherein the first loading adjustment circuit includes a first output loading adjustment circuit coupled to a first output of the first output array group, the first output loading adjustment circuit being configured to adjust an output loading of the first output array group.

5. The power amplifier output stage of claim 1, wherein the second loading adjustment circuit includes a second output loading adjustment circuit coupled to a second output of the second output array group, the second output loading adjustment circuit being configured to adjust an output loading of the second output array group.

6. The power amplifier output stage of claim 1, further comprising a first bias adjustment circuit different from the first loading adjustment circuit, the first bias adjustment circuit being coupled to the first output array group, the first bias adjustment circuit being configured to adjust a first bias value associated with the first output array group.

7. The power amplifier output stage of claim 6, wherein adjusting of the first bias value further adjusts the first power dissipation value.

8. The power amplifier output stage of claim 6, wherein the first bias value includes at least one of a voltage value or a current value.

9. The power amplifier output stage of claim 1, further comprising a second bias adjustment circuit different from the second loading adjustment circuit, the second bias adjustment circuit being coupled to the second output array group, the second bias adjustment circuit being configured to adjust a second bias value associated with the second output array group.

10. The power amplifier output stage of claim 9, wherein adjusting of the second bias value further adjusts the second power dissipation value.

11. The power amplifier output stage of claim 9, wherein the second bias value includes at least one of a voltage value or a current value.

12. The power amplifier output stage of claim 1, wherein the first plurality of semiconductor devices and the second plurality of semiconductor devices each have a different number of semiconductor devices.

13. The power amplifier output stage of claim 1, wherein the first plurality of semiconductor devices and the second plurality of semiconductor devices each have a same number of semiconductor devices.

14. The power amplifier output stage of claim 1, further comprising:
a third output array group comprising a third plurality of semiconductor devices; and
a third loading adjustment circuit coupled to the third output array group, the third loading adjustment circuit being configured to adjust a third loading of the third output array group to produce a third power dissipation value associated with the third output array group.

15. The power amplifier output stage of claim 14, further comprising a third bias adjustment circuit coupled to the third output array group, the third bias adjustment circuit being configured to adjust a third bias value associated with the third output array group.

16. The power amplifier output stage of claim 14, wherein the third power dissipation value is less than at least one of the first power dissipation value or the second power dissipation value.

17. A device, comprising:
a transceiver; and
a power amplifier output stage coupled to the transceiver, the power amplifier output stage including:
a first output array group comprising a first plurality of semiconductor devices;
a first loading adjustment circuit coupled to the first output array group, the first loading adjustment circuit being configured to adjust a first loading of the first output array group to produce a first power dissipation value associated with the first output array group;
a second output array group comprising a second plurality of semiconductor devices; and
a second loading adjustment circuit coupled to the second output array group, the second loading adjustment circuit being configured to adjust a second loading of the second output array group to produce a second power dissipation value associated with the second output array group,
wherein the first loading adjustment circuit adjusts the first loading to produce the first power dissipation value associated with the first output array group and the second loading adjustment circuit adjusts the second loading to produce the second power dissipation value associated with the second output array group to compensate for thermal coupling such that more even thermal distribution across the first output array group and the second output array group is achieved.

18. The device of claim 17, wherein the first loading adjustment circuit includes a first source loading adjustment circuit coupled to a first input of the first output array group, the first source loading adjustment circuit being configured to adjust a first source loading of the first output array group.

19. The device of claim 17, wherein the second loading adjustment circuit includes a second source loading adjustment circuit coupled to a second input of the second output array group, the second source loading adjustment circuit being configured to adjust a second source loading of the second output array group.

20. The device of claim 17, wherein the first loading adjustment circuit includes a first output loading adjustment circuit coupled to a first output of the first output array group, the first output loading adjustment circuit being configured to adjust an output loading of the first output array group.

21. The device of claim 17, wherein the second loading adjustment circuit includes a second output loading adjustment circuit coupled to a second output of the second output array group, the second output loading adjustment circuit being configured to adjust an output loading of the second output array group.

22. The device of claim 17, further comprising a first bias adjustment circuit different from the first loading adjustment circuit, the first bias adjustment circuit being coupled to the first output array group, the first bias adjustment circuit being configured to adjust a first bias value associated with the first output array group.

23. The device of claim 22, wherein adjusting of the first bias value further adjusts the first power dissipation value.

24. The device of claim 22, wherein the first bias value includes at least one of a voltage value or a current value.

25. The device of claim 17, further comprising a second bias adjustment circuit different from the second loading adjustment circuit, the second bias adjustment circuit being coupled to the second output array group, the second bias adjustment circuit being configured to adjust a second bias value associated with the second output array group.

26. The device of claim 25, wherein adjusting of the second bias value further adjusts the second power dissipation value.

27. The device of claim 25, wherein the second bias value includes at least one of a voltage value or a current value.

28. The device of claim 17, wherein the first plurality of semiconductor devices and the second plurality of semiconductor devices each have a different number of semiconductor devices.

29. The device of claim 17, wherein the first plurality of semiconductor devices and the second plurality of semiconductor devices each have a same number of semiconductor devices.

30. The device of claim 17, further comprising:
a third output array group comprising a third plurality of semiconductor devices, the third output array group being positioned between the first output array group and the second output array group; and
a third loading adjustment circuit coupled to the third output array group, the third loading adjustment circuit being configured to adjust a third loading of the third output array group to produce a third power dissipation value associated with the third output array group.

31. The device of claim 30, further comprising a third bias adjustment circuit coupled to the third output array group, the third bias adjustment circuit being configured to adjust a third bias value associated with the third output array group.

32. The device of claim 30, wherein the third power dissipation value is less than at least one of the first power dissipation value or the second power dissipation value.

33. The device of claim 17, wherein the device comprises one of a user equipment (UE) or a base station.

34. A power amplifier output stage comprising:
a first output array group comprising a first plurality of semiconductor devices;
a first output loading adjustment circuit coupled to a first output of the first output array group, the first output loading adjustment circuit being configured to adjust a first output loading of the first output array group;
a first source loading adjustment circuit coupled to a first input of the first output array group, the first source loading adjustment circuit being configured to adjust a first source loading of the first output array group, adjusting of the first output loading and the first source loading of the first output array group producing a first power dissipation value associated with the first output array group;
a second output array group comprising a second plurality of semiconductor devices;
a second output loading adjustment circuit coupled to a second output of the second output array group, the second output loading adjustment circuit being configured to adjust a second output loading of the second output array group; and
a second source loading adjustment circuit coupled to a second input of the second output array group, the second source loading adjustment circuit being configured to adjust a second source loading of the second output array group, adjusting of the second output loading and the second source loading of the second output array group producing a second power dissipation value associated with the second output array group,
wherein the producing the first power dissipation value associated with the first output array group and the producing the second power dissipation value associated with the second output array group compensate for thermal coupling such that more even thermal distribution across the first output array group and the second output array group is achieved.

35. The power amplifier output stage of claim 34, further comprising a first bias adjustment circuit different from the first output loading adjustment circuit and different from the first source loading adjustment circuit, the first bias adjustment circuit being coupled to the first output array group, the first bias adjustment circuit being configured to adjust a first bias value associated with the first output array group.

36. The power amplifier output stage of claim 35, wherein adjusting of the first bias value further adjusts the first power dissipation value.

37. The power amplifier output stage of claim 34, further comprising a second bias adjustment circuit different from the second output loading adjustment circuit and different from the second source loading adjustment circuit, the second bias adjustment circuit being coupled to the second output array group, the second bias adjustment circuit being configured to adjust a second bias value associated with the second output array group.

38. The power amplifier output stage of claim 37, wherein adjusting of the second bias value further adjusts the second power dissipation value.

39. A method, comprising:
adjusting a first loading of a first output array group of a power amplifier output stage to produce a first power dissipation value associated with the first output array group, the first output array group comprising a first plurality of semiconductor devices; and
adjusting a second loading of a second output array group of the power amplifier output stage to produce a second power dissipation value associated with the second output array group, the second output array group comprising a second plurality of semiconductor devices,
wherein the adjusting the first loading to produce the first power dissipation value associated with the first output array group and the adjusting the second loading to produce the second power dissipation value associated with the second output array group compensate for thermal coupling such that more even thermal distribution across the first output array group and the second output array group is achieved.

40. The method of claim 39, wherein adjusting the first loading of the first output array group further comprises adjusting a first source loading of the first output array group.

41. The method of claim 39, wherein adjusting the second loading of the second output array group further comprises adjusting a second source loading of the second output array group.

42. The method of claim 39, wherein adjusting the first loading of the first output array group further comprises adjusting a first output loading of the first output array group.

43. The method of claim 39, wherein adjusting the second loading of the second output array group further comprises adjusting a second output loading of the second output array group.

44. The method of claim 39, further comprising adjusting a first bias value associated with the first output array group, wherein adjusting of the first bias value further adjusts the first power dissipation value.

45. The method of claim 44, wherein the first bias value includes at least one of a voltage value or a current value.

46. The method of claim 39, further comprising adjusting a second bias value associated with the second output array group, wherein adjusting of the second bias value further adjusts the second power dissipation value.

47. The method of claim 46, wherein the second bias value includes at least one of a voltage value or a current value.

* * * * *